United States Patent
Lin

(10) Patent No.: US 9,881,867 B1
(45) Date of Patent: Jan. 30, 2018

(54) CONDUCTIVE CONNECTION STRUCTURE HAVING STRESS BUFFER LAYER

(71) Applicant: NANYA TECHNOLOGY CORPORATION, Taoyuan (TW)

(72) Inventor: Po-Chun Lin, Changhua County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 15/409,551

(22) Filed: Jan. 19, 2017

(51) Int. Cl.
*H01L 23/48* (2006.01)
*H01L 23/522* (2006.01)
*H01L 23/528* (2006.01)

(52) U.S. Cl.
CPC ........ *H01L 23/5226* (2013.01); *H01L 23/528* (2013.01)

(58) Field of Classification Search
CPC ............. H01L 23/481; H01L 23/53223; H01L 23/53238; H01L 23/53252; H01L 23/53266
USPC .................................................. 257/774, 773
See application file for complete search history.

(56) References Cited

U.S. PATENT DOCUMENTS

| | | | |
|---|---|---|---|
| 8,354,736 B2 | 1/2013 | Moroz | |
| 8,436,448 B2 | 5/2013 | Chen | |
| 8,772,946 B2* | 7/2014 | Uzoh | H01L 21/76898 257/737 |
| 9,659,858 B2* | 5/2017 | Mohammed | H01L 23/5226 |
| 9,704,818 B1* | 7/2017 | Lin | H01L 24/13 |
| 9,711,442 B1* | 7/2017 | Lin | H01L 23/49827 |
| 2009/0243047 A1* | 10/2009 | Wolter | H01L 23/481 257/621 |
| 2011/0057326 A1* | 3/2011 | Kai | H01L 21/31116 257/774 |
| 2012/0013022 A1* | 1/2012 | Sabuncuoglu Tezcan | H01L 21/7682 257/774 |
| 2012/0139127 A1* | 6/2012 | Beyne | H01L 21/764 257/774 |
| 2012/0217611 A1* | 8/2012 | Liu | H01L 21/76898 257/508 |
| 2015/0115462 A1* | 4/2015 | Lin | H01L 23/481 257/774 |
| 2015/0141767 A1* | 5/2015 | Rogers | A61B 5/0084 600/301 |
| 2017/0221796 A1* | 8/2017 | Lin | H01L 23/481 257/621 |

FOREIGN PATENT DOCUMENTS

| | | |
|---|---|---|
| TW | 201209982 A | 3/2012 |
| TW | 201405739 A | 2/2014 |

* cited by examiner

*Primary Examiner* — Alexander Oscar Williams
(74) *Attorney, Agent, or Firm* — CKC & Partners Co., Ltd.

(57) ABSTRACT

A conductive connection structure includes a semiconductor substrate, a conductive pillar, and a stress buffer layer. The conductive pillar is in the semiconductor substrate. The stress buffer layer is between the semiconductor substrate and the conductive pillar. The conductive pillar has a protruding portion penetrating through the stress buffer layer.

16 Claims, 6 Drawing Sheets

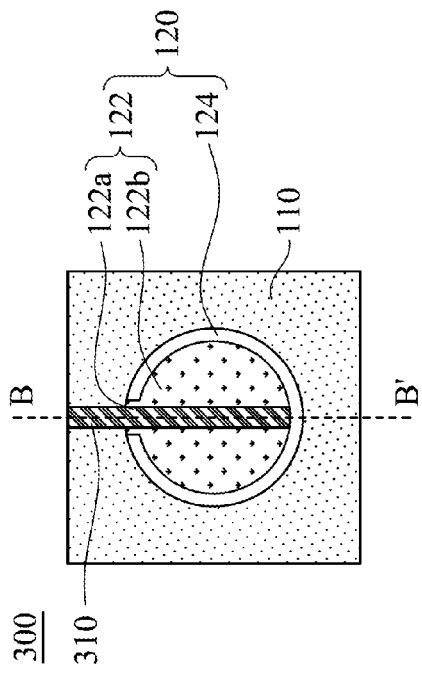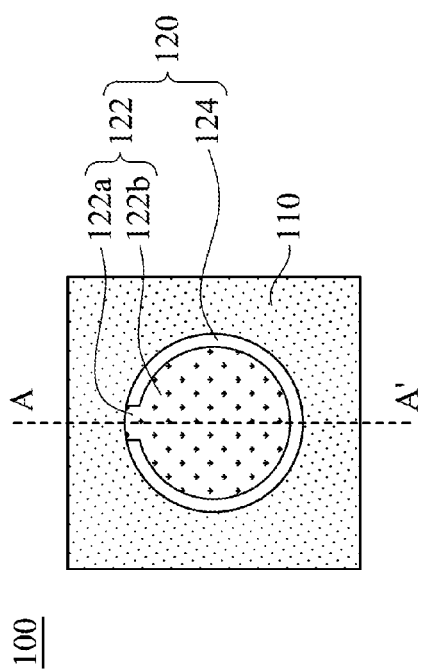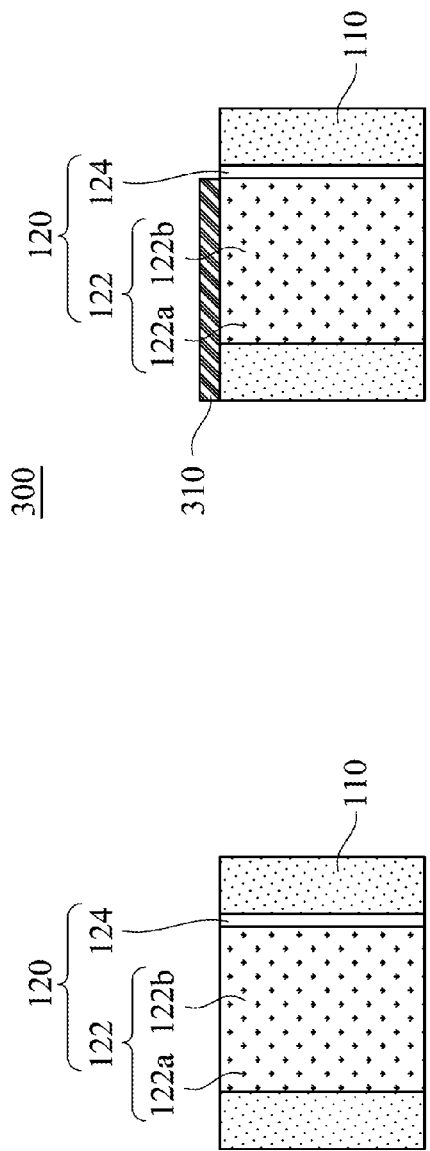
Fig. 1
Fig. 2
Fig. 3A
Fig. 3B

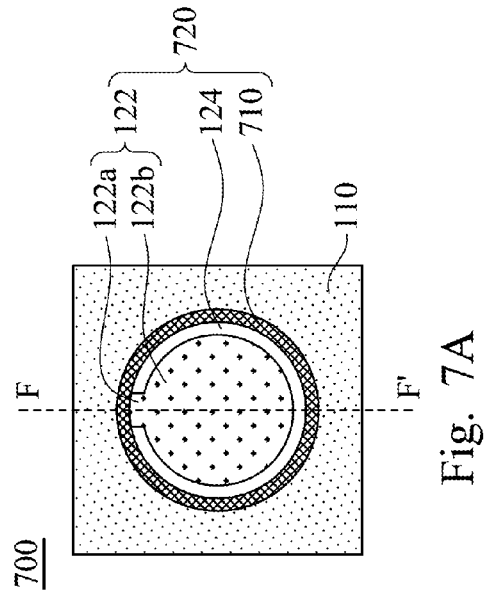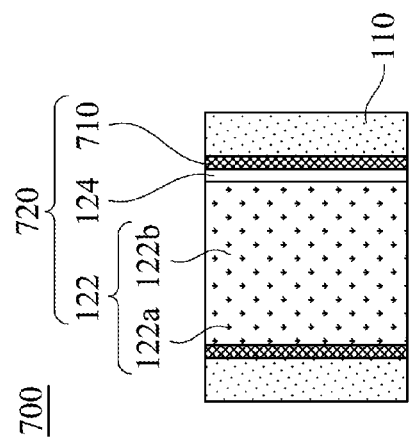
Fig. 6A
Fig. 6B
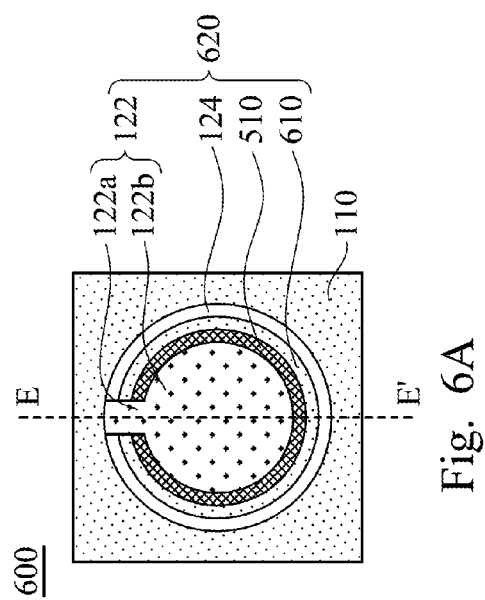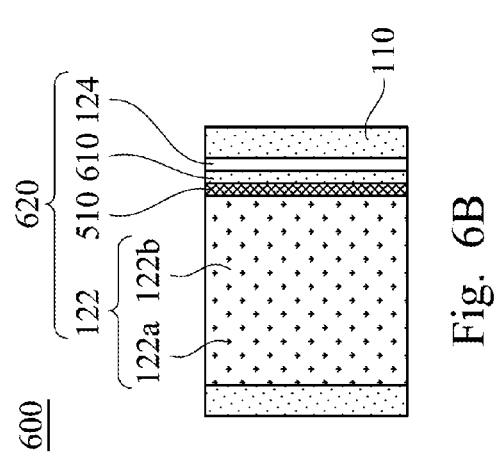
Fig. 7A
Fig. 7B

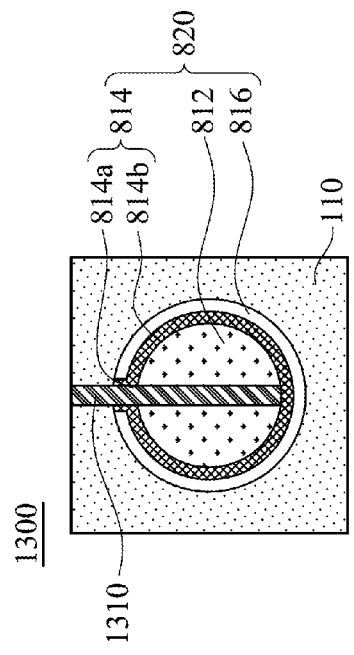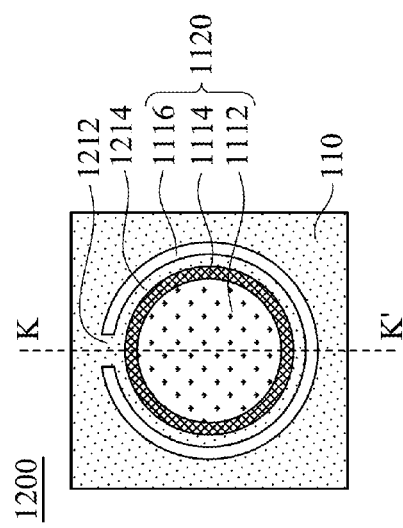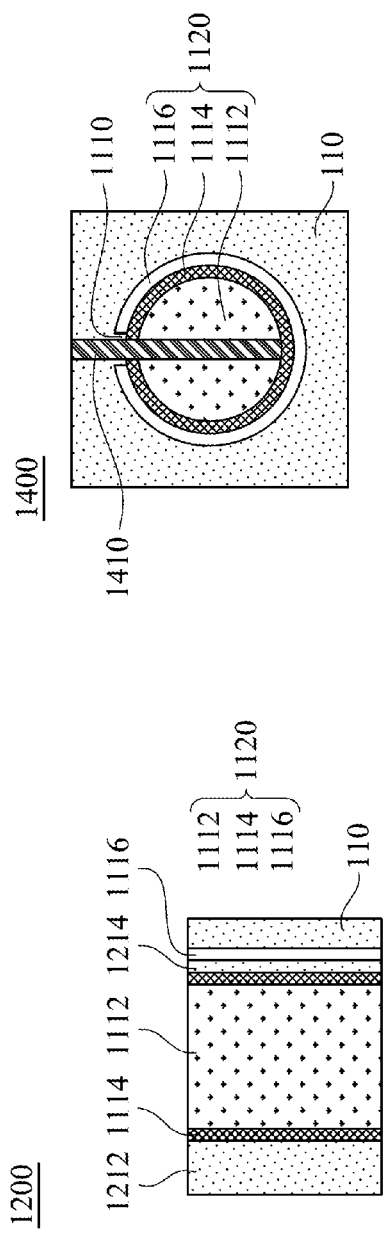
Fig. 12A
Fig. 12B
Fig. 13
Fig. 14

CONDUCTIVE CONNECTION STRUCTURE HAVING STRESS BUFFER LAYER

BACKGROUND

Field of Invention

The present invention relates to a conductive connection structure. More particularly, the present invention relates to a conductive connection structure having a stress buffer layer.

Description of Related Art

In order to improve performance and functionality of integrated circuits (ICs), three-dimensional (3D) stacking technology are generally applied in the next generation. Through silicon vias (TSVs) are generally used to create a 3D stacking, which could be diced or polished after bonding.

However, differences of thermal properties between a substrate and the internal TSVs could degrade interface properties under thermal cycling conditions. More specifically, when the substrate and the TSVs are deformed due to temperature change, because the amount of deformation of the TSVs is different from the substrate, the TSVs would easily under stress, which adversely influences the electrical performance of the TSVs.

Therefore, an improved via structure is necessary to reduce the undesirable stress.

SUMMARY

The present disclosure provides a conductive connection structure which includes a semiconductor substrate, a conductive pillar, and a stress buffer layer. The conductive pillar is in the semiconductor substrate. The stress buffer layer is between the semiconductor substrate and the conductive pillar. The conductive pillar has a protruding portion penetrating through the stress buffer layer.

In one embodiment, the stress buffer layer is an elastic material layer or an air gap layer.

In one embodiment, a Young's modulus of the elastic material layer is smaller than a Young's modulus of the conductive pillar.

In one embodiment, the protruding portion of the conductive pillar is in direct contact with the semiconductor substrate.

In one embodiment, the conductive connection structure further includes a dielectric layer between the stress buffer layer and the semiconductor substrate.

In one embodiment, the conductive connection structure further includes a dielectric layer between the conductive pillar and the stress buffer layer.

In one embodiment, the conductive connection structure further includes a semiconductor layer between the dielectric layer and the stress buffer layer.

In one embodiment, the conductive connection structure further includes a dielectric layer between the stress buffer layer and the semiconductor substrate.

In one embodiment, the protruding portion of the conductive pillar is in direct contact with the dielectric layer.

In one embodiment, the conductive connection structure further includes a conductive line in direct contact with the protruding portion of the conductive pillar.

The present disclosure provides a conductive connection structure which includes a semiconductor substrate, a conductive pillar, a dielectric layer, and a stress buffer layer. The conductive pillar is in the semiconductor substrate. The dielectric layer is between the semiconductor substrate and the conductive pillar and has a connection portion connecting the semiconductor substrate and the conductive pillar. The stress buffer layer surrounds the conductive pillar.

In one embodiment, the stress buffer layer is an elastic material layer or an air gap layer.

In one embodiment, the stress buffer layer is between the dielectric layer and the semiconductor substrate.

In one embodiment, the conductive connection structure further includes a semiconductor layer between the dielectric layer and the stress buffer layer.

In one embodiment, the stress buffer layer is between the dielectric layer and the conductive pillar.

In one embodiment, the conductive connection structure further includes a conductive line in direct contact with the connection portion of the dielectric layer and the conductive pillar.

The present disclosure provides a conductive connection structure which includes a semiconductor substrate, a conductive pillar, a dielectric layer, and a stress buffer layer. The conductive pillar is in the semiconductor substrate. The dielectric layer surrounds the conductive pillar. The stress buffer layer surrounds the conductive pillar. The semiconductor substrate has a protruding portion penetrating through the stress buffer layer.

In one embodiment, the stress buffer layer is an elastic material layer or an air gap layer.

In one embodiment, the semiconductor substrate has a portion separating the dielectric layer from the stress buffer layer.

In one embodiment, the conductive connection structure further includes a conductive line in direct contact with the protruding portion of the semiconductor substrate and the conductive pillar.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows:

FIGS. 1, 3A, 4A, 5A, 6A, 7A, 8A, 9A, 10A, 11A, and 12A are plan views of conductive connection structures according to some embodiments of the present disclosure.

FIGS. 2, 3B, 4B, 5B, 6B, 7B, 8B, 9B, 10B, 11B, and 12B are a cross-sectional view of FIG. 1 along the line AA', a cross-sectional view of FIG. 3A along the line BB', a cross-sectional view of FIG. 4A along the line CC', a cross-sectional view of FIG. 5A along the line DD', a cross-sectional view of FIG. 6A along the line EE', a cross-sectional view of FIG. 7A along the line FF', a cross-sectional view of FIG. 8A along the line GG', a cross-sectional view of FIG. 9A along the line HH', a cross-sectional view of FIG. 10A along the line II', a cross-sectional view of FIG. 11A along the line JJ', and a cross-sectional view of FIG. 12A along the line KK', respectively.

FIGS. 13 and 14 are plan views of conductive connection structures according to some embodiment of the present disclosure.

DETAILED DESCRIPTION

Figure 5A:
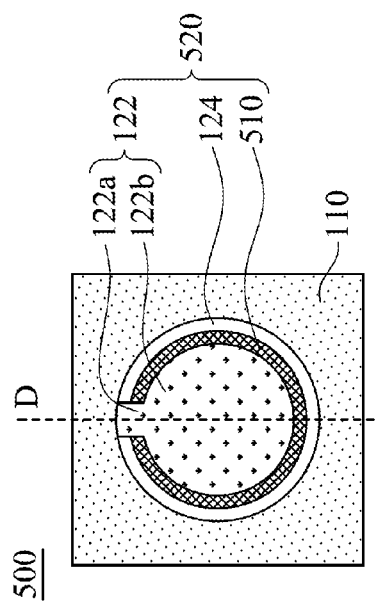

Reference will now be made in detail to the present embodiments of the invention, examples of which are illustrated in the accompanying drawings. Wherever possible, the same reference numbers are used in the drawings and the description to refer to the same or like parts.

In order to solve the adverse influences caused by stress, the present disclose provides conductive connection structures as shown in FIGS. 1-14. These conductive connection structures include via structures having stress buffer layers respectively. Therefore, when stress occurs in the improved via structures, the stress buffer layers could relax the stress.

Please refer to FIGS. 1 and 2. FIG. 1 is a plan view of a conductive connection structure 100 according to one embodiment of the present disclosure. FIG. 2 is a cross-sectional view of FIG. 1 along the line AA'. The conductive connection structure 100 includes a semiconductor substrate 110 and a via structure 120 embedded in the semiconductor substrate 110. In one embodiment, a material of the semiconductor substrate 110 includes silicon or a compound semiconductor, such as silicon carbide, gallium arsenide, indium arsenide, and indium phosphide. The semiconductor substrate 110 may include various doping configurations depending on design requirements as is known in the art (e.g., p-type substrate or n-type substrate). The via structure 120 includes a conductive pillar 122 and a stress buffer layer 124. In one embodiment, a material of the conductive pillar 122 includes metal or polysilicon. The conductive pillar 122 has a protruding portion 122a and a portion 122b. The stress buffer layer 124 is between the semiconductor substrate 110 and the conductive pillar 122. The protruding portion 122a penetrates through the stress buffer layer 124 and therefore is in direct contact with the semiconductor substrate 110. The portion 122b is surrounded by the stress buffer layer 124. Further, as shown in FIG. 2, the via structure 120 penetrates through the semiconductor substrate 110. However, in another embodiment, the conductive connection structure 100 further includes a dielectric layer (not shown) between the protruding portion 122a and the semiconductor substrate 110, such that the protruding portion 122a is not in contact with the semiconductor substrate 110. For example, the dielectric layer may surround the protruding portion 122a or surround both the protruding portion 122a and the portion 122b.

As shown in FIG. 1, the stress buffer layer 124 separates the portion 122b of the conductive pillar 122 from the semiconductor substrate 110; however, the portion 122b is still connected with the semiconductor substrate 110 through the protruding portion 122a.

In one embodiment, the stress buffer layer 124 is an elastic material layer. In one embodiment, a Young's modulus of the elastic material layer is smaller than a Young's modulus of the conductive pillar 122. For example, a Young's modulus of the elastic material layer is in a range from about 0.5 GPa to about 50 GPa. The elastic material layer may include polyimide (PI), benzocyclobutene (BCB), or a combination thereof. Young's modulus (modulus of elasticity) is calculated with dividing the tensile stress by the extension strain. While applying the same tensile stress, the elastic material layer with smaller Young's modulus will have larger extension strain, which means the elastic material layer is soft and elastic to relax the stress in the conductive pillar 122 to prevent the conductive connection structure 100 from being damaged. In another embodiment, the stress buffer layer 124 is an air gap layer. The air gap layer could provide sufficient space to contain the deformation portion of the conductive pillar 122 when stress occurs in the conductive pillar 122. In other words, air gap layer could also help the conductive pillar 122 to relax inner stress.

Please refer to FIGS. 3A and 3B. FIG. 3A is a plan view of a conductive connection structure 300 according to one embodiment of the present disclosure. FIG. 3B is a cross-sectional view of FIG. 3A along the line BB'. The conductive connection structure 300 includes the semiconductor substrate 110, the via structure 120, and a conductive line 310. The conductive connection structure 300 is similar to the conductive connection structure 100. The difference between the conductive connection structures 100 and 300 is that the conductive connection structure 300 further includes the conductive line 310 on the semiconductor substrate 110 and the via structure 120. More specifically, the conductive line 310 is in direct contact with the protruding portion 122a and the portion 122b of the conductive pillar 122. In another embodiment, the conductive line 310 is not in contact with the portion 122b of the conductive pillar 122, or, in other words, the conductive line 310 is only in direct contact with the protruding portion 122a.

The conductive line 310 may be formed by the following steps. A dielectric layer (not shown) is formed on the semiconductor substrate 110, the conductive pillar 122, and the stress buffer layer 124, and then is patterned to form at least one hole to expose at least the protruding portion 122a of the conductive pillar 122. Subsequently, the conductive line 310 is formed in the at least one hole and in direct contact with the protruding portion 122a of the conductive pillar 122.

As shown in FIG. 3B, the conductive line 310 is not in contact with the stress buffer layer 124; therefore, when stress occurs in the conductive pillar 122, and the conductive pillar 122 is deformed, the conductive line 310 would not be pulled and dragged by the stress buffer layer 124. In other words, such structural design can prevent the conductive line 310 from metal fatigue.

Figure 4A:
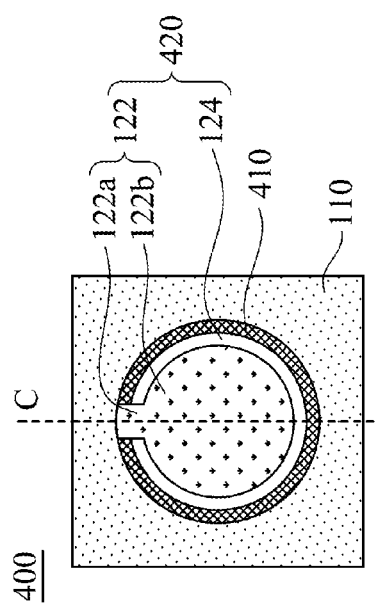
Figure 4B:
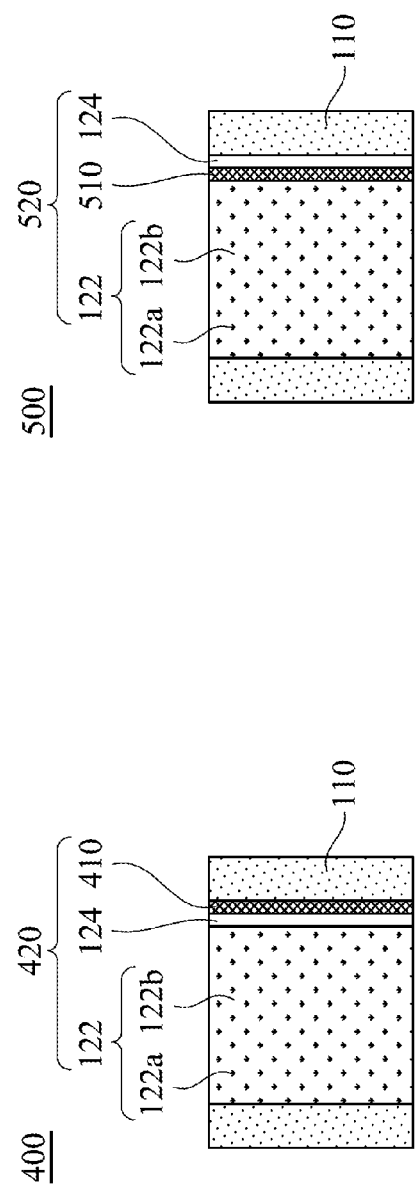

Please refer to FIGS. 4A and 4B. FIG. 4A is a plan view of a conductive connection structure 400 according to one embodiment of the present disclosure. FIG. 4B is a cross-sectional view of FIG. 4A along the line CC'. The conductive connection structure 400 includes the semiconductor substrate 110 and a via structure 420 embedded in the semiconductor substrate 110. The via structure 420 includes the conductive pillar 122, the stress buffer layer 124, and a dielectric layer 410. The conductive connection structure 400 is similar to the conductive connection structure 100. The difference between the conductive connection structures 100 and 400 is that the conductive connection structure 400 further includes the dielectric layer 410.

More specifically, the stress buffer layer 124 is between the conductive pillar 122 and the dielectric layer 410, and the dielectric layer 410 is between the stress buffer layer 124 and the semiconductor substrate 110. The protruding portion 122a penetrates through the stress buffer layer 124 and the dielectric layer 410, and therefore is in direct contact with the semiconductor substrate 110. Further, as shown in FIG. 4B, the via structure 420 penetrates through the semiconductor substrate 110.

Figure 5B:
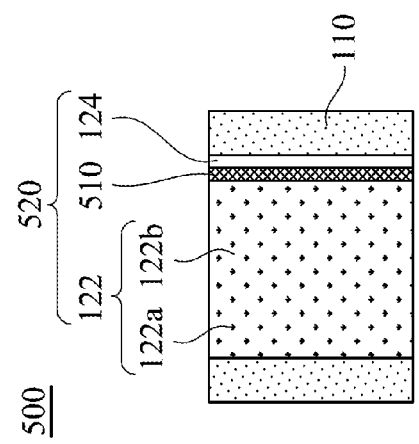

Please refer to FIGS. 5A and 5B. FIG. 5A is a plan view of a conductive connection structure 500 according to one embodiment of the present disclosure. FIG. 5B is a cross-sectional view of FIG. 5A along the line DD'. The conductive connection structure 500 includes the semiconductor substrate 110 and a via structure 520 embedded in the semiconductor substrate 110. The via structure 520 includes the conductive pillar 122, the stress buffer layer 124, and a dielectric layer 510. The conductive connection structure 500 is similar to the conductive connection structure 100. The difference between the conductive connection structures 100 and 500 is that the conductive connection structure 500 further includes the dielectric layer 510.

More specifically, the stress buffer layer 124 is between the semiconductor substrate 110 and the dielectric layer 510, and the dielectric layer 510 is between the stress buffer layer 124 and the conductive pillar 122. The protruding portion 122a penetrates through the stress buffer layer 124 and the dielectric layer 510, and therefore is in direct contact with the semiconductor substrate 110. Further, as shown in FIG. 5B, the via structure 520 penetrates through the semiconductor substrate 110.

Please refer to FIGS. 6A and 6B. FIG. 6A is a plan view of a conductive connection structure 600 according to one embodiment of the present disclosure. FIG. 6B is a cross-sectional view of FIG. 6A along the line EE'. The conductive connection structure 600 includes the semiconductor substrate 110 and a via structure 620 embedded in the semiconductor substrate 110. The via structure 620 includes the conductive pillar 122, the stress buffer layer 124, the dielectric layer 510, and a semiconductor layer 610. The conductive connection structure 600 is similar to the conductive connection structure 500. The difference between the conductive connection structures 500 and 600 is that the conductive connection structure 600 further includes the semiconductor layer 610.

More specifically, the semiconductor layer 610 is between the dielectric layer 510 and the stress buffer layer 124. The protruding portion 122a penetrates through the dielectric layer 510, the semiconductor layer 610, and the stress buffer layer 124, and therefore is in direct contact with the semiconductor substrate 110. Further, as shown in FIG. 6B, the via structure 620 penetrates through the semiconductor substrate 110.

Please refer to FIGS. 7A and 7B. FIG. 7A is a plan view of a conductive connection structure 700 according to one embodiment of the present disclosure. FIG. 7B is a cross-sectional view of FIG. 7A along the line FF'. The conductive connection structure 700 includes a semiconductor substrate 110 and a via structure 720 embedded in the semiconductor substrate 110. The via structure 720 includes a conductive pillar 122, a stress buffer layer 124, and a dielectric layer 710. The conductive connection structure 700 is similar to the conductive connection structure 100. The difference between the conductive connection structures 100 and 700 is that the conductive connection structure 700 further includes the dielectric layer 710.

More specifically, the stress buffer layer 124 is between the conductive pillar 122 and the dielectric layer 710, and the dielectric layer 710 is between the stress buffer layer 124 and the semiconductor substrate 110. The protruding portion 122a penetrates through the stress buffer layer 124, and therefore is in direct contact with the dielectric layer 710. Further, as shown in FIG. 7B, the via structure 720 penetrates through the semiconductor substrate 110.

Figure 8A:
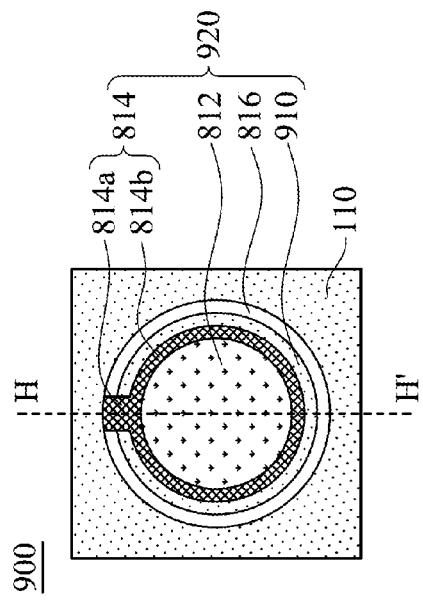
Figure 8B:
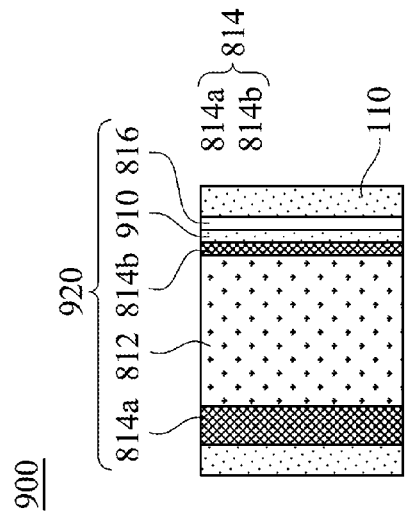

Please refer to FIGS. 8A and 8B. FIG. 8A is a plan view of a conductive connection structure 800 according to one embodiment of the present disclosure. FIG. 8B is a cross-sectional view of FIG. 8A along the line GG'. The conductive connection structure 800 includes the semiconductor substrate 110 and a via structure 820 embedded in the semiconductor substrate 110. The via structure 820 includes a conductive pillar 812, a dielectric layer 814, and a stress buffer layer 816. The dielectric layer 814 surrounds the conductive pillar 812, and the stress buffer layer 816 surrounds the dielectric layer 814; therefore, the stress buffer layer 816 surrounds the conductive pillar 812. In other words, the dielectric layer 814 is between the conductive pillar 812 and the stress buffer layer 816, and the stress buffer layer 816 is between the dielectric layer 814 and the semiconductor substrate 110. The dielectric layer 814 has a connection portion 814a and a portion 814b. The connection portion 814a penetrates through the stress buffer layer 816 to connect the semiconductor substrate 110 and the conductive pillar 812. More specifically, the connection portion 814a is in direct contact with the semiconductor substrate 110 and the conductive pillar 812. The portion 814b is between the conductive pillar 812 and the stress buffer layer 816. Further, as shown in FIG. 8B, the via structure 820 penetrates the semiconductor substrate 110.

As shown in FIG. 8A, the stress buffer layer 816 separates the conductive pillar 812 from the semiconductor substrate 110; however, the conductive pillar 812 is surrounded by the dielectric layer 814 and is connected with the semiconductor substrate 110 through the connection portion 814a of the dielectric layer 814. In one embodiment, the stress buffer layer 816 is an elastic material layer or an air gap layer. Further, structural details, such as material and modulus, of the stress buffer layer 816 can refer to the stress buffer layer 124. There is no need to give unnecessary details.

Figure 9A:
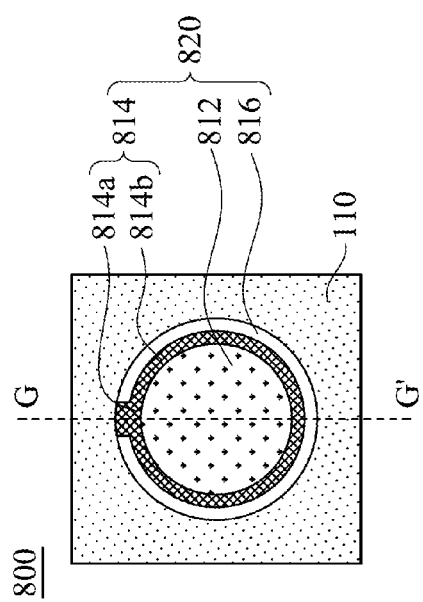
Figure 9B:
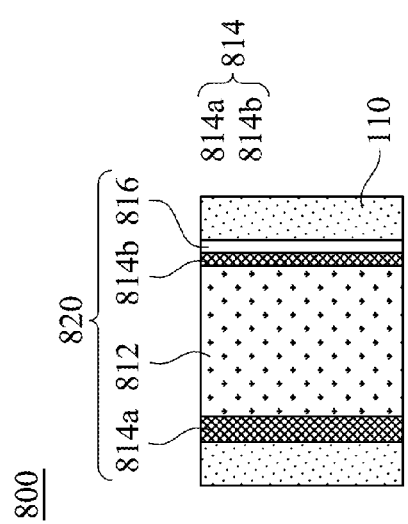

Please refer to FIGS. 9A and 9B. FIG. 9A is a plan view of a conductive connection structure 900 according to one embodiment of the present disclosure. FIG. 9B is a cross-sectional view of FIG. 9A along the line HH'. The conductive connection structure 900 includes the semiconductor substrate 110 and a via structure 920 embedded in the semiconductor substrate 110. The via structure 920 includes the conductive pillar 812, the dielectric layer 814, a semiconductor layer 910, and the stress buffer layer 816. The conductive connection structure 900 is similar to the conductive connection structure 800. The difference between the conductive connection structures 800 and 900 is that the conductive connection structure 900 further includes the semiconductor layer 910.

More specifically, the stress buffer layer 816 surrounds the semiconductor layer 910, and the semiconductor layer 910 surrounds the dielectric layer 814. In other words, the semiconductor layer 910 is between the dielectric layer 814 and the stress buffer layer 816. The connection portion 814a penetrates through the stress buffer layer 816 and the semiconductor layer 910 to connect the semiconductor substrate 110 and the conductive pillar 812. Further, as shown in FIG. 9B, the via structure 920 penetrates the semiconductor substrate 110.

Figure 10A:
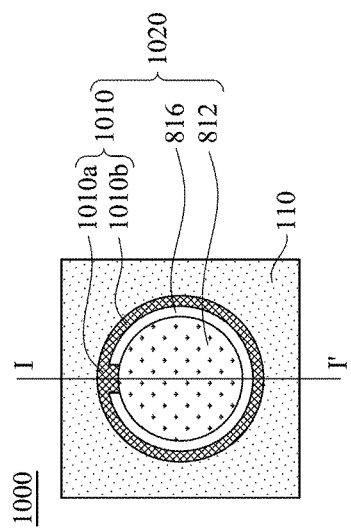
Figure 10B:
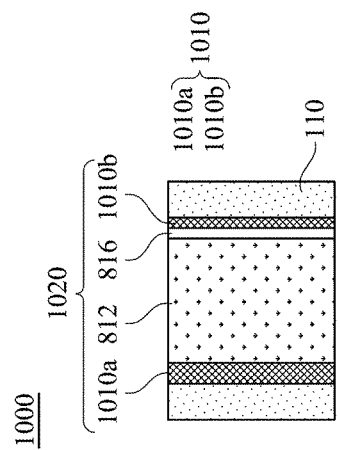

Please refer to FIGS. 10A and 10B. FIG. 10A is a plan view of a conductive connection structure 1000 according to one embodiment of the present disclosure. FIG. 10B is a cross-sectional view of FIG. 10A along the line II'. The conductive connection structure 1000 includes the semiconductor substrate 110 and a via structure 1020 embedded in the semiconductor substrate 110. The via structure 1020 includes the conductive pillar 812, the stress buffer layer 816, and a dielectric layer 1010. The conductive connection structure 1000 is similar to the conductive connection structure 800. The difference between the conductive connection structures 800 and 1000 is that the dielectric layer 1010 of the conductive connection structure 1000 is between the stress buffer layer 816 and the semiconductor substrate 110 rather than between the stress buffer layer 816 and the conductive pillar 812.

More specifically, the dielectric layer 1010 surrounds the stress buffer layer 816, and the stress buffer layer 816 surrounds the conductive pillar 812. In other words, the dielectric layer 1010 is between the stress buffer layer 816 and the semiconductor substrate 110, and the stress buffer layer 816 is between conductive pillar 812 and the dielectric layer 1010. The dielectric layer 1010 has a connection portion 1010a and a portion 1010b. The connection portion 1010a penetrates through the stress buffer layer 816 to connect the semiconductor substrate 110 and the conductive pillar 812. More specifically, the connection portion 1010a is in direct contact with the semiconductor substrate 110 and the conductive pillar 812. The portion 1010b surrounds the stress buffer layer 816. Further, as shown in FIG. 10B, the via structure 1020 penetrates the semiconductor substrate 110.

Figure 11A:
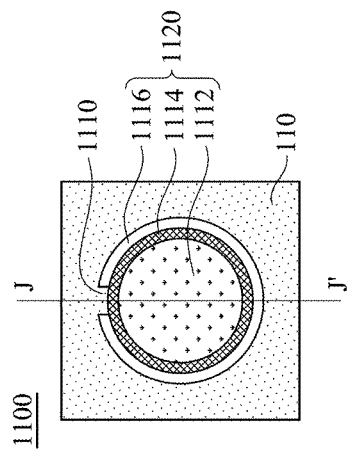
Figure 11B:
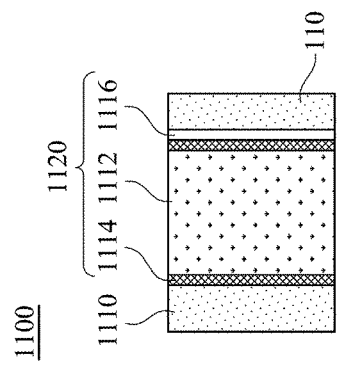

Please refer to FIGS. 11A and 11B. FIG. 11A is a plan view of a conductive connection structure 1100 according to one embodiment of the present disclosure. FIG. 11B is a cross-sectional view of FIG. 11A along the line JJ'. The conductive connection structure 1100 includes the semiconductor substrate 110 and a via structure 1120 embedded in the semiconductor substrate 110. The via structure 1120 includes a conductive pillar 1112, a dielectric layer 1114, and a stress buffer layer 1116. The dielectric layer 1114 surrounds the conductive pillar 1112, and the stress buffer layer 1116 surrounds the dielectric layer 1114, and therefore the stress buffer layer 1116 surrounds the conductive pillar 1112. In other words, the dielectric layer 1114 is between the conductive pillar 1112 and the stress buffer layer 1116, and the stress buffer layer 1116 is between the dielectric layer 1114 and the semiconductor substrate 110. The semiconductor substrate 110 has a protruding portion 1110 penetrating through the stress buffer layer 1116. The protruding portion 1110 is in direct contact with the dielectric layer 1114 to connect the dielectric layer 1114 and the conductive pillar 1112 with the semiconductor substrate 110. Further, as shown in FIG. 11B, the via structure 1120 penetrates through the semiconductor substrate 110. In another embodiment, the stress buffer layer 1116 is between the conductive pillar 1112 and the dielectric layer 1114, and the protruding portion 1110 penetrates through the dielectric layer 1114 and the stress buffer layer 1116 to be in contact with the conductive pillar 1112.

As shown in FIG. 11A, the stress buffer layer 1116 separates the conductive pillar 1112 from the semiconductor substrate 110; however, the conductive pillar 1112 is surrounded by the dielectric layer 1114 and is connected with the semiconductor substrate 110 through the protruding portion 1110 of the semiconductor substrate 110. In one embodiment, the stress buffer layer 1116 is an elastic material layer or an air gap layer. Further, structural details, such as material and modulus, of the stress buffer layer 1116 can refer to the stress buffer layer 124. There is no need to give unnecessary details.

Please refer to FIGS. 12A and 12B. FIG. 12A is a plan view of a conductive connection structure 1200 according to one embodiment of the present disclosure. FIG. 12B is a cross-sectional view of FIG. 12A along the line KK'. The conductive connection structure 1200 includes the semiconductor substrate 110 and the via structure 1120 embedded in the semiconductor substrate 110. The conductive connection structure 1200 is similar to the conductive connection structure 1100. The difference between the conductive connection structures 1100 and 1200 is that the conductive connection structure 1200 has a portion of the semiconductor substrate 110 between the dielectric layer 1114 and the stress buffer layer 1116.

More specifically, the semiconductor substrate 110 has a protruding portion 1212 and a portion 1214. The protruding portion 1212 penetrates through the stress buffer layer 1116 and is in direct contact with the dielectric layer 1114 to connect the dielectric layer 1114 and the conductive pillar 1112 with the semiconductor substrate 110. The portion 1214 is between the dielectric layer 1114 and the stress buffer layer 1116, and surrounds the dielectric layer 1114. In other words, the portion 1214 separates the dielectric layer 1114 from the stress buffer layer 1116. Further, as shown in FIG. 12B, the via structure 1120 penetrates through the semiconductor substrate 110.

Please refer to FIGS. 13. FIG. 13 is a plan view of a conductive connection structure 1300 according to one embodiment of the present disclosure. The conductive connection structure 1300 includes the semiconductor substrate 110, the via structure 820, and a conductive line 1310.

Please refer to FIGS. 14. FIG. 14 is a plan view of a conductive connection structure 1400 according to one embodiment of the present disclosure. The connection structure 1400 includes the semiconductor substrate 110, the via structure 1120, and a conductive line 1410. The conductive connection structure 1400 is similar to the conductive connection structure 1100. The difference between the conductive connection structures 1100 and 1400 is that the conductive connection structure 1400 further includes the conductive line 1410. The conductive line 1410 is on the semiconductor substrate 110 and the via structure 1120. More specifically, the conductive line 1410 is in direct contact with the protruding portion 1110 of the semiconductor substrate 110 and the conductive pillar 1112.

Given above, the present disclosure provides various conductive connection structures. Each of the conductive connection structures includes a via structure with a stress buffer layer, which could relax stress in the via structure. Moreover, some conductive connection structures includes conductive lines electrically connecting with the via structure. It should be noted that each of the conductive lines is disposed on the protruding portion of the conductive pillar, the connection portion of the dielectric layer, or the protruding portion of the semiconductor substrate. In other words, each of the conductive lines is not in contact with the stress buffer layer. Such structural design can prevent the conductive lines from metal fatigue. Accordingly, the conductive connection structures of the present disclosure would have good quality.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:
1. A conductive connection structure, comprising:
a semiconductor substrate;
a conductive pillar in the semiconductor substrate;
a stress buffer layer between the semiconductor substrate and the conductive pillar, wherein the conductive pillar has a protruding portion penetrating through the stress buffer layer, and
a dielectric layer between the stress buffer layer and the semiconductor substrate, wherein the protruding portion of the conductive pillar is in direct contract with the dielectric layer.

2. The conductive connection structure of claim 1, wherein the stress buffer layer is an elastic material layer or an air gap layer.

3. The conductive connection structure of claim 2, wherein a Young's modulus of the elastic material layer is smaller than a Young's modulus of the conductive pillar.

4. The conductive connection structure of claim 1, wherein the protruding portion of the conductive pillar is in direct contact with the semiconductor substrate.

5. The conductive connection structure of claim 4, further comprising a dielectric layer between the stress buffer layer and the semiconductor substrate.

6. The conductive connection structure of claim 1, further comprising a dielectric layer between the conductive pillar and the stress buffer layer.

7. The conductive connection structure of claim 6, further comprising a semiconductor layer between the dielectric layer and the stress buffer layer.

8. The conductive connection structure of claim 1, further comprising a conductive line in direct contact with the protruding portion of the conductive pillar.

9. A conductive connection structure, comprising:
   a semiconductor substrate;
   a conductive pillar in the semiconductor substrate;
   a dielectric layer between the semiconductor substrate and the conductive pillar, and the dielectric layer having a connection portion connecting the semiconductor substrate and the conductive pillar;
   a stress buffer layer surrounding the conductive pillar and between the dielectric layer and the semiconductor substrate; and
   a semiconductor layer between the dielectric layer and the stress buffer layer.

10. The conductive connection structure of claim 9, wherein the stress buffer layer is an elastic material layer or an air gap layer.

11. The conductive connection structure of claim 9, wherein the stress buffer layer is between the dielectric layer and the conductive pillar.

12. The conductive connection structure of claim 9, further comprising a conductive line in direct contact with the connection portion of the dielectric layer and the conductive pillar.

13. A conductive connection structure, comprising:
   a semiconductor substrate;
   a conductive pillar in the semiconductor substrate;
   a dielectric layer surrounding the conductive pillar; and
   a stress buffer layer surrounding the conductive pillar, wherein the semiconductor substrate has a protruding portion penetrating through the stress buffer layer.

14. The conductive connection structure of claim 13, wherein the stress buffer layer is an elastic material layer or an air gap layer.

15. The conductive connection structure of claim 13, wherein the semiconductor substrate has a portion separating the dielectric layer from the stress buffer layer.

16. The conductive connection structure of claim 13, further comprising a conductive line in direct contact with the protruding portion of the semiconductor substrate and the conductive pillar.

* * * * *